(12) United States Patent
Rice

(10) Patent No.: US 9,246,247 B2
(45) Date of Patent: *Jan. 26, 2016

(54) SURFACE MOUNT ZIPCORD CONNECTOR AND METHOD OF MAKING ELECTRICAL CONTACT WITH ZIPCORD CONDUCTORS

(71) Applicant: Zierick Manufacturing Corporation, Mount Kisco, NY (US)

(72) Inventor: Daniel Rice, Tarrytown, NY (US)

(73) Assignee: Zierick Manufacturing Corporation, Mount Kisco, NY (US)

( * ) Notice: Subject to any disclaimer, the term of this patent is extended or adjusted under 35 U.S.C. 154(b) by 19 days.

This patent is subject to a terminal disclaimer.

(21) Appl. No.: 14/012,562

(22) Filed: Aug. 28, 2013

(65) Prior Publication Data

US 2014/0065855 A1 Mar. 6, 2014

Related U.S. Application Data

(60) Provisional application No. 61/693,845, filed on Aug. 28, 2012.

(51) Int. Cl.
```
H01R 12/00      (2006.01)
H01R 11/16      (2006.01)
H01R 12/71      (2011.01)
H05K 3/30       (2006.01)
H01R 4/24       (2006.01)
H01R 12/57      (2011.01)
H05K 3/32       (2006.01)
```

(52) U.S. Cl.
CPC ............... *H01R 11/16* (2013.01); *H01R 4/242* (2013.01); *H01R 12/57* (2013.01); *H01R 12/712* (2013.01); *H05K 3/30* (2013.01); *H05K 3/32* (2013.01); *H05K 2201/1031* (2013.01); *H05K 2201/10356* (2013.01); *H05K 2201/10962* (2013.01); *Y10T 29/5327* (2015.01)

(58) Field of Classification Search
CPC ...................................................... H01R 11/16
USPC ............. 439/83, 84, 877, 421, 422, 423, 424, 439/425, 85, 90, 86; 29/761; 174/84
See application file for complete search history.

(56) References Cited

U.S. PATENT DOCUMENTS

| | | | | |
|---|---|---|---|---|
| 4,669,798 A * | 6/1987 | Daum et al. | ................... | 439/423 |
| 6,799,990 B2 * | 10/2004 | Wendling | ............... | H01R 12/68 |
| | | | | 439/422 |
| 7,591,666 B2 * | 9/2009 | Legrady | ............... | H01R 4/2404 |
| | | | | 439/424 |
| 7,955,147 B1 * | 6/2011 | Legrady | ................... | H01R 4/20 |
| | | | | 439/83 |
| 2014/0060929 A1 * | 3/2014 | Rice | ......................... | H05K 3/32 |
| | | | | 174/84 C |

* cited by examiner

*Primary Examiner* — Abdullah Riyami
*Assistant Examiner* — Nader J Alhawamdeh
(74) *Attorney, Agent, or Firm* — Myron Greenspan

(57) ABSTRACT

A surface mount connector includes one or two spaced conductive contacts. Each conductive contact(s) include a substantially flat base portion suitable for soldering to a pad or land on a printed circuit board (PCB), At least one vertical finger extends substantially normally from each flat base portion and each terminates in a point or hook formed with a piercing tip at the free end thereof remote from the that base portion. The vertical finger(s) and flat base portion(s) define a space for receiving an insulated conductor arranged in a plane substantially parallel to the plane of the flat base portion(s). The finger(s) are directed inwardly at their free end(s) proximate to the piercing tip(s) and configured to deflect inwardly in a curling action when forced downwardly and crimped to pierce an associated insulated conductor positioned on the flat base portion(s).

20 Claims, 12 Drawing Sheets

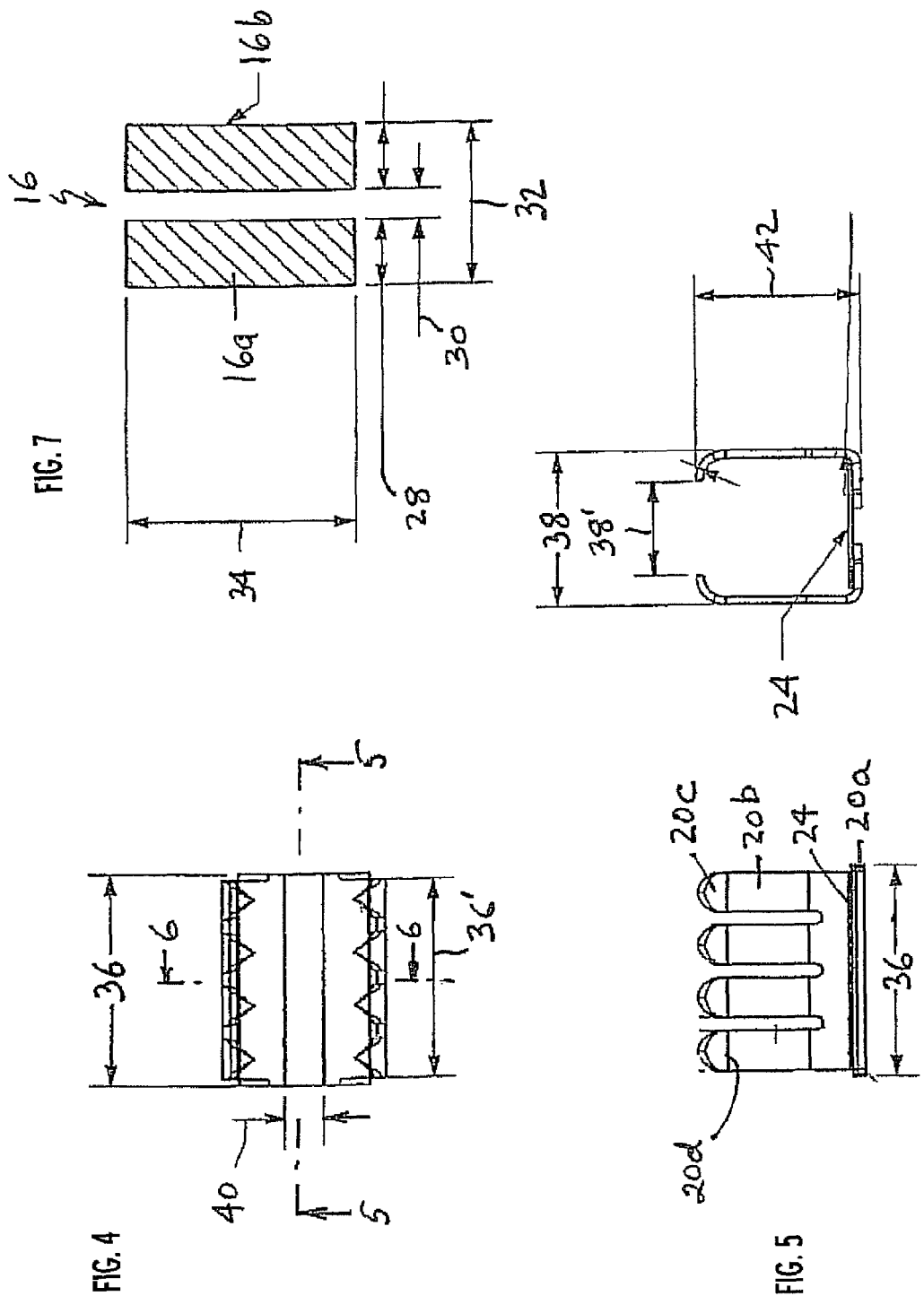

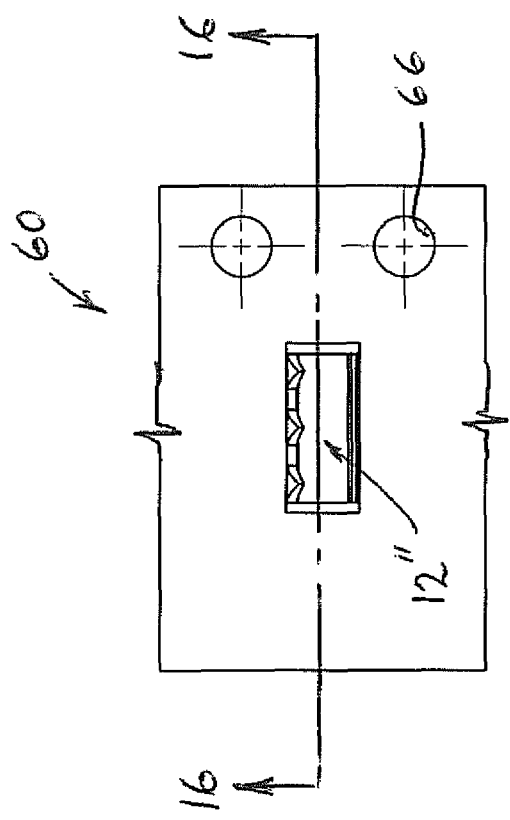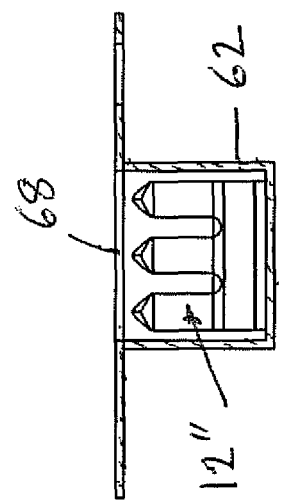
FIG. 15
FIG. 16

SURFACE MOUNT ZIPCORD CONNECTOR AND METHOD OF MAKING ELECTRICAL CONTACT WITH ZIPCORD CONDUCTORS

BACKGROUND OF THE INVENTION

1. Field of the Invention

The invention generally relates to surface mount connectors and, more specifically, to a surface mount connector for securing a zipcord to a printed circuit board and method of making electrical contact with zipcord conductors.

2. Description of the Prior Art

Manufactures want to be able to use zipcord and attach the same to a printed circuit board (PCB), zipcords being inexpensive cables of two insulated wires bonded together along their length. To make a functional surface mount zipcord connector several technical problems need to be solved. The connector needs to be capable of piercing the insulation and make good connection with both internal wires or conductors while causing damage to a minimum number of wire strands. The connector also needs to provide strain relieve to hold the wire securely. Additionally, the connector needs to be capable of being mounted on a PCB easily and crimped in one action. Preferably, such connectors do not require preparation of the zipcord prior to termination.

U.S. Pat. No. 2,680,235 is for an "Electrical Connector" for terminating a conductor and includes opposing ears that form barbs that are suitable for piercing the insulation and making contact with a central conductor. However, this patent teaches a connector for a single conductor, not a zipcord and there is no suggestion that the electrical connector can or should be surface mounted.

U.S. Pat. No. 6,461,188 to Reul is for a "Solderable Electrical Connection Element with a Solder Deposit". The patent teaches attachment of conducting track or metal conductors by means of a soldered joint that can be made using a solder deposit.

An "Insulation Displacement Connector (IDC)" is disclosed in U.S. Pat. Nos. 7,833,045 and 7,955,116 to Bishop. These patents are designed to connect one or more insulated wires to a component such as a printed circuit board. However, the receptacle for each of the wires is separated by a surface 22 that would prevent its use with a standard zipcord without first splitting the cord into two individual conductors. These patents disclose a plurality of generally standard IDC connectors arranged in tandem to receive as few or as many individual conductors.

SUMMARY OF THE INVENTION

Accordingly, it is an object of the present invention to provide a surface mount connector for securing a zipcord that does not possess the disadvantages inherent in prior art connectors.

It is another object of the present invention to provide a surface mount zipcord connector that is simple in construction and economical to manufacture.

It still another object of the present invention to provide a surface mount zipcord connector that can be easily and efficiently surface mounted by a pick-and-place machine.

It is yet another object of the present invention to provide a surface mount zipcord connector as in the previous objects that maintains the individual conductors for each of the zipcord wires at predetermined desired spacings from each other suitable for surface mounting on fixed lands or pads on a PCB.

It is a further object of the present invention to provide a surface mount zipcord connector of the type under discussion that can be placed on a PCB easily in one action.

It is still another object of the present invention to provide a surface mount zipcord connector as in the previous objects that does not require pretreatment for the wires.

It is yet a further object of the present invention to provide a surface mount zipcord connector that allows the wires of the zipcord to continue beyond the connector for further termination in parallel on the same circuit board.

It is an additional object of the present invention to provide a surface mount zipcord connector as in the previous objects that provides good electrical and mechanical contact with the wires of the zipcord with minimal damage to the wires strands within the conductors.

It is also an additional object of the present invention to provide a surface mount zipcord connector as in the previous object that provides good strain relief to hold the wires securely.

It is yet an additional object to provide a simple and convenient method of closing a surface mount zipcord connector as in the previous objects to make electrical contact with one or both conductors of the zipcord.

In order to achieve the above and other objects a surface mount zipcord connector in accordance with the invention includes a pair of conductors spaced from each other at predetermined distance. Each conductor comprises a substantially flat base portion suitable for soldering to a pad or land on a printed circuit board (PCB). Each conductor is provided with at least one but preferably with plurality of spaced vertical fingers extending substantially normal from the base portion and each terminating in a piercing tip. Non-conductive means such as nonconductive tips is provided for maintaining the spaced base portions of the conductors at a set predetermined distance. The conductors define a space for receiving a zipcord or a pair connected insulated conductors arranged in a plane substantially parallel to the plane of the base portions. The fingers are directed inwardly at the upper ends proximate to the tips at the free ends and configured to deflect inwardly in a curling action when forced downwardly to pierce the associated zipcord wires.

BRIEF DESCRIPTION OF THE DRAWINGS

Those skilled in the art will appreciate the improvements and advantages that derive from the present invention upon reading the following detailed description, claims, and drawings, in which:

FIG. 4 is a top plan view of a surface mount zipcord connector in accordance with the invention prior to surface mounting;

FIG. 5 is a longitudinal cross sectional view of the connector shown in FIG. 4, taken along the line 5-5;

FIG. 6 is a transverse cross sectional view of the connector shown in FIG. 4, taken along the line 6-6;

FIG. 7 is a top plan view of a pair of lands or pads of the type that can be formed on a printed circuit board for being attached to the surface mount zipcord connector;

FIG. 15 is a plan view of a modified zipcord connector for contacting one wire of a zipcord or other single insulated wire or conductor housed in a pocket on a tape;

FIG. 16 is a cross-sectional view of the connector taken along line 16-16 in FIG. 15;

DESCRIPTION OF PREFERRED EMBODIMENT

Figure 1:
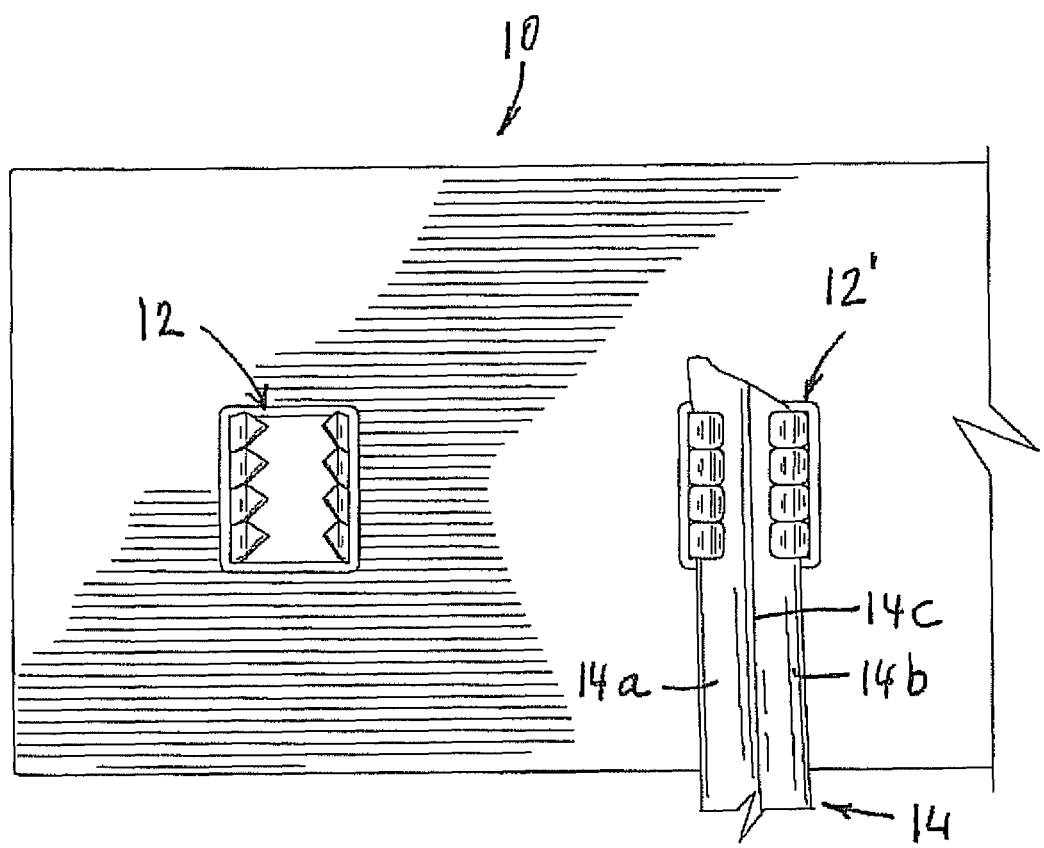
FIG. 1 is a top plan view of a printed circuit board on which there are mounted two surface mount zipcord connectors in accordance with the invention, one prior to receiving a zipcord and the other with a zipcord securely mounted after the fingers of the zipcord have been deformed and have pierced associated wires of the zipcord.

Referring now specifically to the Figures, in which identical or similar parts are designated by the same reference numerals throughout, and first referring to FIG. 1, a printed circuit board (PCB) 10 is illustrated bearing two surface mount zipcord connectors in accordance with the present invention. The first connector 12 is shown in its open condition, prior to receiving a zipcord and a similar second connector 12' is shown with a zipcord 14 received therein for providing good mechanical as well as electrical connection with the conductive strands within the zipcord, as it will be more fully described.

The zipcord 14 is generally a relatively inexpensive cable formed of two insulated conductors 14a, 14b with their insulations bonded together at a thin frangible, rupture or parting line 14c to facilitate, when desired, the separation of the two conductors 14a, 14b from each other by severing or rupturing the zipcord along the relatively weak parting or separation line 14c.

Figure 2:
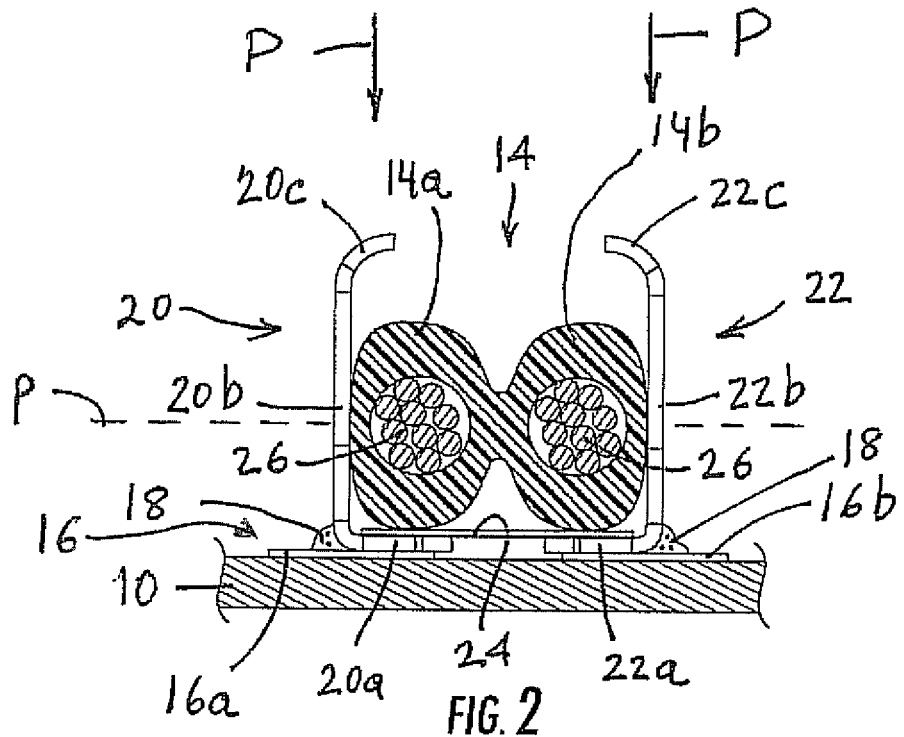
FIG. 2. is a transverse cross section through the surface mount zipcord connector with a zipcord arranged therein prior to deformation of the piercing fingers.
Figure 3:
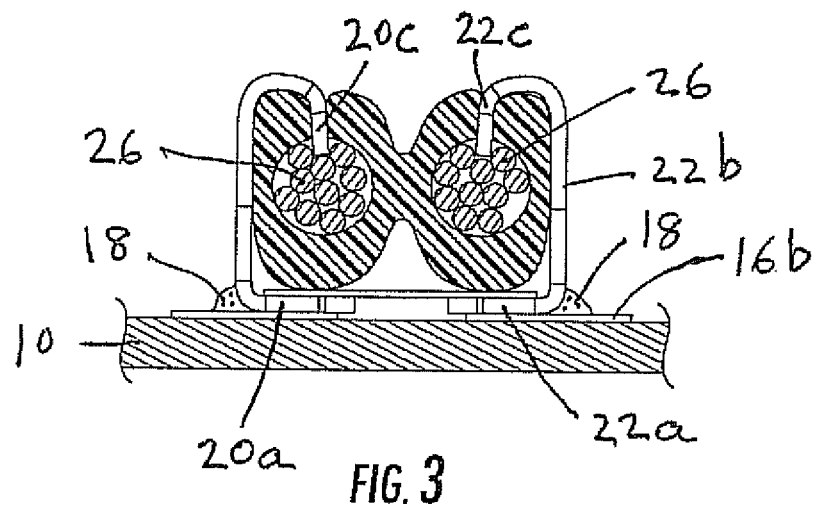
FIG. 3 is similar to FIG. 2 but shown after the piercing fingers have been inwardly deflected to pierce the insulation and conductors in associated zipcord wires.

Referring to FIGS. 2-6, each zipcord connector 12 is dimensioned and configured to be surface mounted on a pair of lands or solder pads 16. The solder pads are formed of two generally rectangular lands or pads 16a, 16b (FIG. 7) that are made of copper and are formed on a PCB in a conventional manner. As shown in FIGS. 2 and 3, the connector 12 is surface mounted on the lands or pads 16a, 16b by means of solder 18 that may be applied in any conventional way such as reflow soldering.

Referring to FIG. 2, each connector 12 is formed of a pair of legs 20, 22 that are spaced from each other a predetermined distance to accommodate the width of the zipcord and to register with the pads or lands 16. The legs 20, 22 include bottom horizontal base portions 20a, 22a, vertical fingers 20b, 22b and upper piercing points or hooks 20c, 22c, respectively. The legs 20, 22 are similarly shaped but oriented to be mirror reflections of each other, as shown.

In order to maintain the desired spacing between the legs 20, 22 a non-conductive tape 24 is applied to the upper surfaces of the bottom horizontal base portions 20a, 22a, as shown. The tape may be any suitable tape. In the present preferred embodiment, the tape 24 is a polyamide tape such as Kapton® tape.

Referring to FIGS. 2, 3 and 4-6, the legs 20, 22 are positioned to create a space therebetween sufficient to receive a zipcord 14 in which the individual insulated conductors 14a, 14b are arranged in a plane that is substantially parallel to the bottom base portions 20a, 22a and, therefore, substantially parallel to the PCB 10. The height 42 (FIG. 6) of the connector is selected to position the upper piercing tips or hooks 20c, 22c above the zipcord 14 when the latter is placed into contact with the tape 24 as shown in FIGS. 2 and 3. In this manner, when a suitably configured crimping tool applies a pressure P on each of the legs 20b, 22b, the upper piercing points or hooks 20c, 22c are bent inwardly and forced to pierce the insulation, in a curling action, and enter the space with the internal wire strands 26 to make electrical contact therewith while the fingers provide secure mechanical contact with the external insulation 14a, 14b.

Referring to FIGS. 4-7, the spacing 30 between the rectangular pads or lands 16a, 16b can be 0.045" and the width 32 of the pad footprint is approximately 0.245". The length of the pad footprint 34 is approximately 0.33". To accommodate lengths with the aforementioned dimensions, the length 36 of the zipcord connector 12 approximately equals the dimension 34 as approximately 0.32" at the extreme ends, while the effective length of the connector 36' of the connector is approximately 0.3". The width 38 of the connector is approximately equal to the dimension 32 as approximately 0.234". Spacing or gap 40 between the individual contact fingers is approximately equal to the dimension 38 and equal to approximately 0.055". The height 42 of the contacts is approximately 0.247".

In order to facilitate the suggested curling action, the upper piercing points or hooks 20c, 22c may be provided with V-shaped coins, bends or fold lines 20d (FIG. 5).

Since the zipcord connector 12 is intended to be used as a surface mount (SMT) connector it is preferably made in a form in which a plurality of such connectors may be continuously fed to a pick up station of a pick-and-place machine. In this connection the tape 24 forms a good upper surface for a vacuum nozzle (not shown) of a pick-and-place machine. Also, while the upper piercing points or hooks are inwardly directed, as shown, the minimum spacing 38' between them is 0.144" in the illustrated embodiment, selected to assure adequate space for a vacuum nozzle to penetrate into the space for contact with the tape 24.

Figure 11:
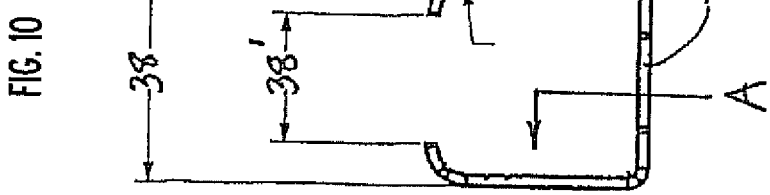
FIG. 11 is a fragmented side elevational view of the fingers forming the connector shown in FIG. 10 as taken along direction A.

Referring to FIG. 11, the upper piercing points or hooks are shown to be provided with a plurality of V-shaped coins 48 that are parallel to each other as shown and spaced from each other a distance 52 that may typically be 0.023". The actual piercing tips 50 of the points or hooks have a height 54 of approximately 0.038".

Figures 8, 9:
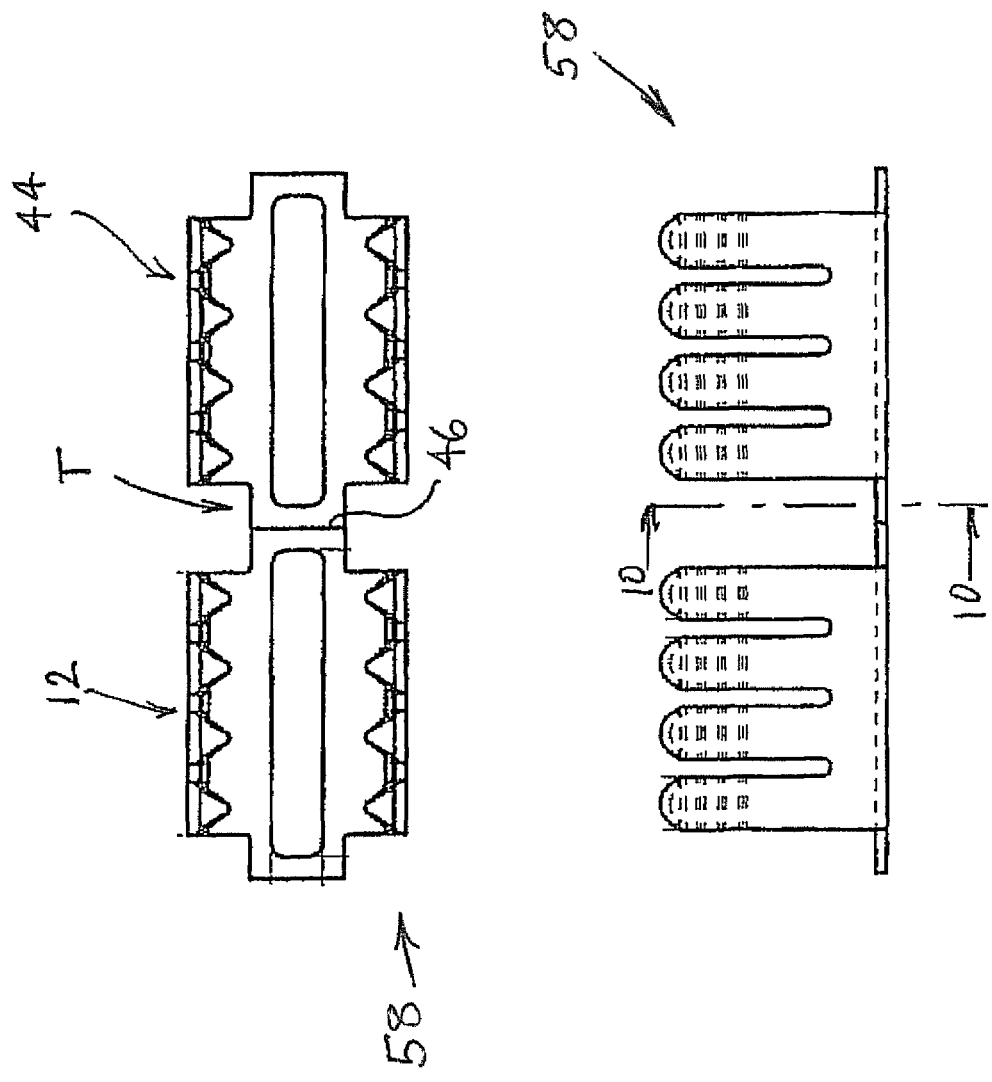
FIG. 8 is an embodiment of the invention in which a strip of surface mount zipcord connectors are formed adjacent ones of which are connected to each other by means of connecting tabs.
FIG. 9 is a side elevational view of the tab-connected connector shown in FIG. 8.
Figure 10:
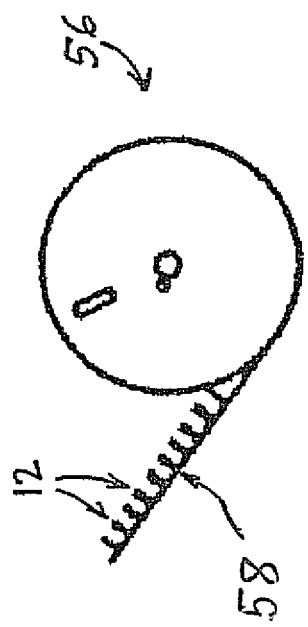
FIG. 10 is a transverse section of the tab-attached connectors shown in FIG. 9 as taken along line 10-10.
Figure 12:
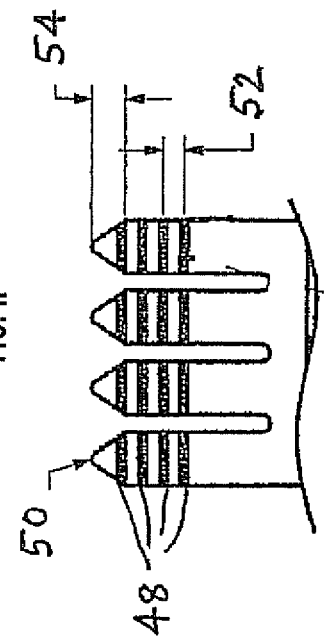
FIG. 12 is a side elevational view of a reel for dispensing tab-attached connectors of the type shown in FIGS. 8 and 9.

In FIG. 12, a strip of connectors 58 is shown coiled about a reel 56 suitable for use of a pick-and-place machine. Referring to FIGS. 8 and 9, adjacent connectors 12 may be connected to each other by intermediate tabs T that have a width to ensure that the tabs are sufficiently flexible to allow the strip 58 to be wound about a reel. A feeding machine can be used to feed successive connectors 12 to a pick up station by severing the endmost connector from the next successive connector at a severance line 46.

Figure 13:
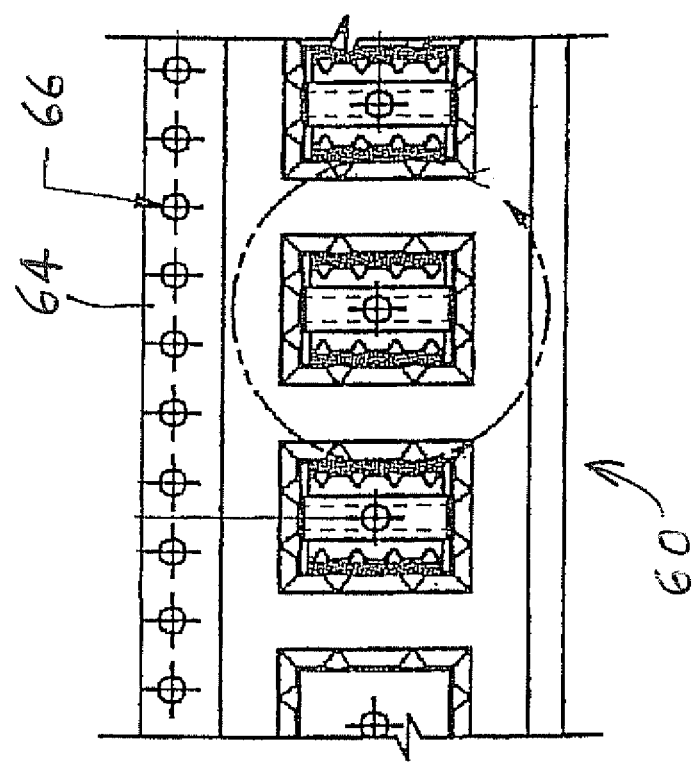
FIG. 13 illustrates another method of dispensing the surface mount zipcord connectors by storing the connectors in pockets on a tape of the type commonly used with pick-and-place machines.
Figure 14:
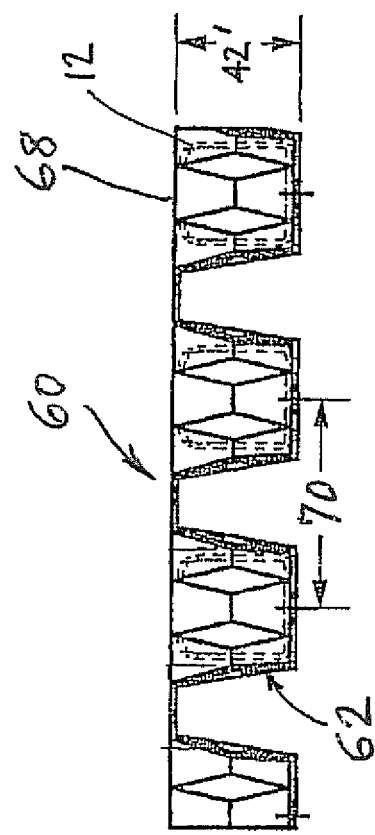
FIG. 14 is a side elevational view of the tape and pockets shown in FIG. 13.

The zipcord connectors may also be fed to a pick up station by means of continuous tape 60 formed with or carrying pockets 62 each for securely receiving one connector as shown in FIGS. 13 and 14. The tape 60 may be formed of a carbon polystyrene or other suitable material. Only one edge 64 of the tape 60 is provided a series of spaced holes 66 as shown that are 0.16" apart and have a diameter of approximately 0.06". These spaced holes are used to register and accurately maintain the position of individual pockets as they enter the pick-and-place machine in a manner or well known in the art. The individual pockets are initially covered with a suitable removable tape 68 that can be removed prior to pick up and may be a Kapton® tape. The tape can also be any known heat sealed or pressure sensitive tape. The spacing between individual pockets is not critical but in the example shown the spacing 70 is approximately 0.47".

Referring to FIGS. 15 and 16, there is shown an alternative version of the SMT connector 12, 12' designated by the reference numeral 12". The connector 12" is essentially one half of the connector 12, cut along a vertical cutting plane normal to the plane defined by the base portions 20a, 22a. The connector 12" can be used in the same way to mechanically and electrically connect to a single insulated wire instead of a double side-by-side wires forming a zipcord. The modified connector 12" is shown within a carrier similar to one shown in FIGS. 13 and 14 in which a continuous carrier tape 60 is provided with registration holes 66 and pockets 62 that are open at the top in the plane of the carrier tape 60 but covered by a removable tape 68. As indicated, this removable tape may be heat sealed or pressure sensitive tape that can be suitably removed from the carrier tape to expose the upper window access opening 70 and to allow a vacuum nozzle of a pick-and-place machine to enter into the pocket 62 for engaging the connector 12" and placing it onto a printed circuit board. This single wire modified SMT connector 12" will be more fully discussed in connection with FIGS. 19-22.

Figure 17:
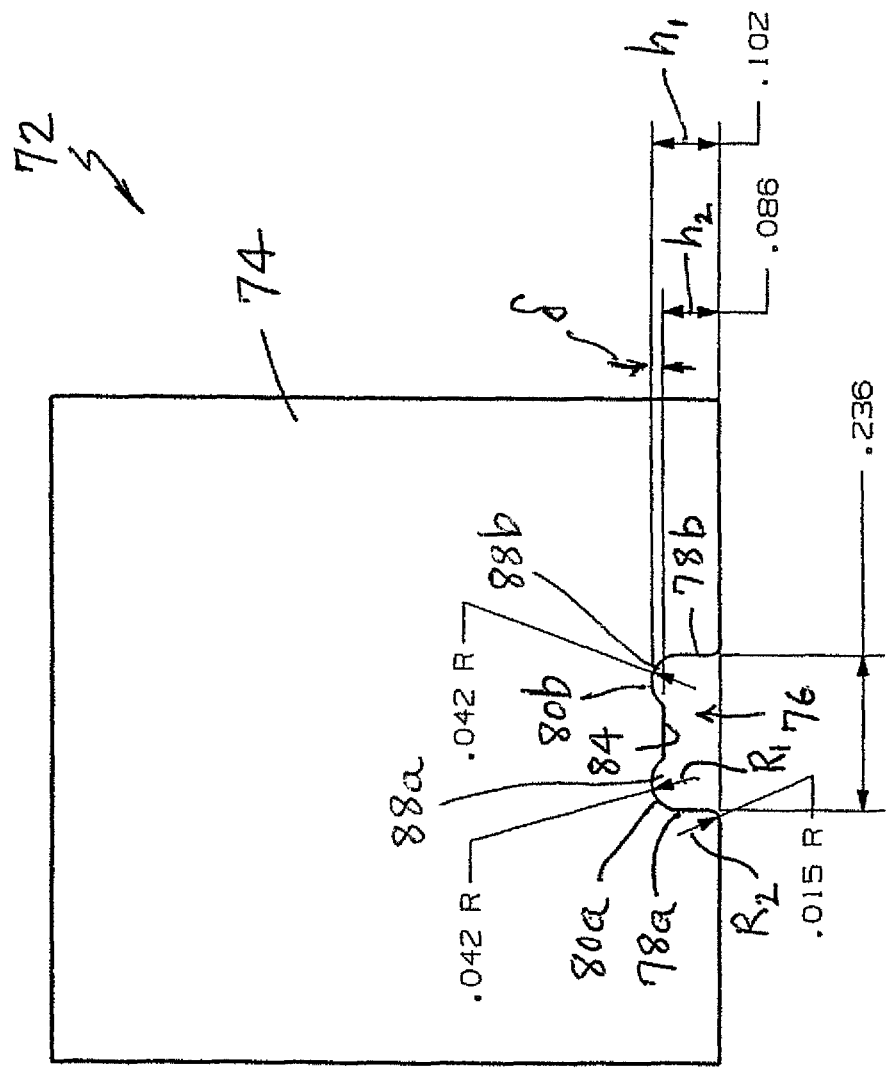
FIG. 17 is an end elevational view of a tool for crimping the prongs of the zipcord to make electrical contact with conductors or stands within the zipcord.
Figure 18:
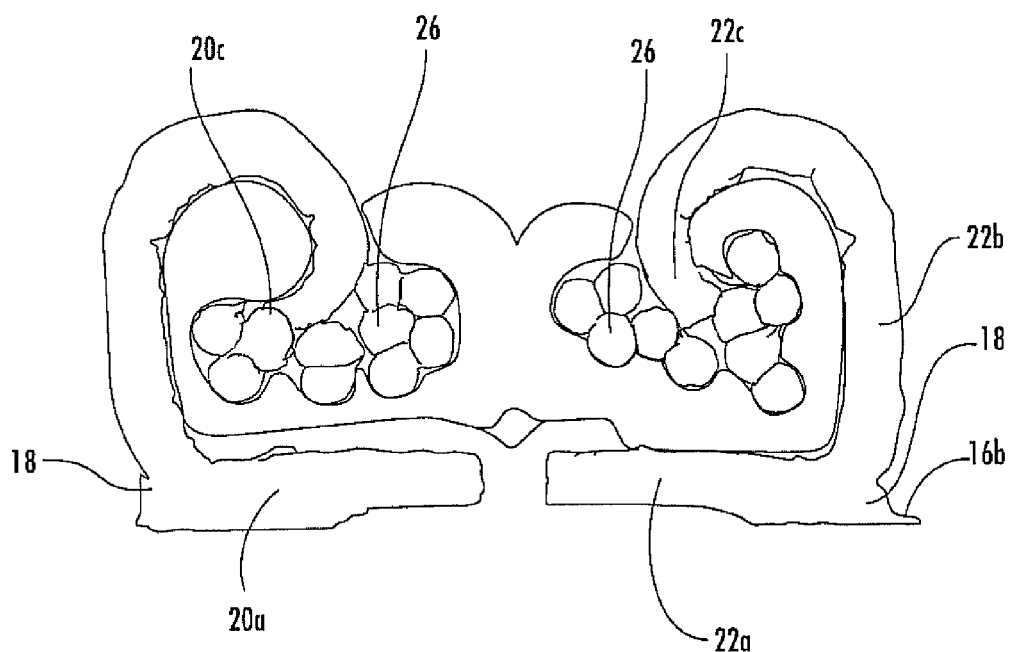
FIG. 18 is a transverse cross-sectional view of an SMT connector in accordance with the invention shown after the piercing prongs have been crimped and deflected inwardly to mechanically secure the zipcord and make electrical contact with the conductors or strands therein.

Referring to FIG. 17, a tool for crimping the fingers 22 of the connectors 12 is illustrated and designated by the reference numeral 72. The tool 72 may be made of any suitable hard and durable material, such as stainless steel, and arranged to be supported by a press (not shown) that selectively moves it from an upper position in which it does not engage the connector to a bottom-most position in which it is lowered sufficiently to fully crimp the fingers 22 so that they pierce the insulation and engage or make electrical contact with the internal conductors or strands as shown in FIG. 3. The block 74 is formed, along a lower base surface S, with a cavity 76 having a width $w_1$ that substantially corresponds to the width 38 of an SMT connector 12 as shown in FIG. 6. Preferably, the width $w_1$ is somewhat greater than the width 38 of the connector to allow the connector to be received within the cavity 76 with some clearance. The cavity 76 has two spaced substantially upright surfaces 78a, 78b that respectively merge into cylindrical surfaces 88a, 88b as shown in FIG. 17. The cylindrical surfaces have a radius $R_1$. A rounded surface is provided at the point where the lower base surface S and the vertical walls 78a, 78b merge, as shown, each resulting round having a radius $R_2$. A bearing surface 84, at a height $h_2$ above the base surface S, is substantially parallel to the lower surface S extends between the two cylindrical surfaces 80a, 80b as shown, such that the bearing surface 84 is spaced a distance δ that is equal to the difference between the upper most height $h_1$ of the cavity 76 the height $h_2$ of the bearing surface 84. The height $h_1$ is selected to ensure that the fingers 22 can be properly crimped and forced inwardly and downwardly to make contact with the inner conductors and still able to receive the SMT connector as well as the zipcord therein. The bearing surface 84 is positioned at a height $h_2$ to contain the conductors and insulation that might otherwise be forced upwardly and outwardly between the opposing sets of fingers. In the example illustrated, the radius $R_1$ is equal to 0.042", the radius $R_2$ is equal to 0.015", the height $h_1$ is equal to 0.102" while the height $h_2$ is equal to 0.086". This produces a δ of 0.016" or δ is equal to approximately 16% of the overall height $h_1$ of the cavity 76. Preferably δ is selected to be within a range of 10-25% of the maximum height of the cavity $h_1$. In FIG. 18, an enlarged cross-sectional view is shown of an SMT crimp piercing connector 12' after it has been crimped and deformed by the tool 72 while maintaining the insulation as well as most of the conductors in contact with the fingers by limiting their movements and preventing them from being forced upwardly between the fingers.

Figure 19:
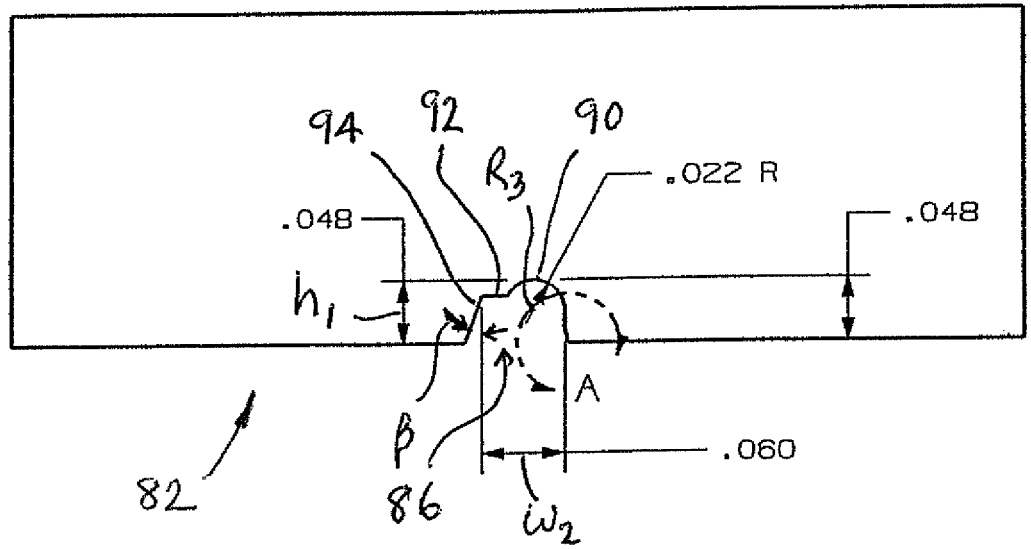
FIG. 19 is similar to FIG. 17 but shows a modified tool for crimping and deflecting one single row of prongs for engaging a single wire.
Figure 20:
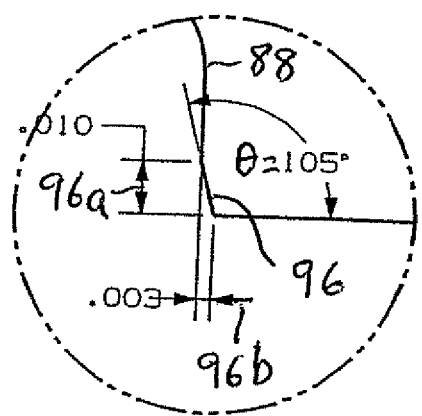
FIG. 20 is an enlarged detail of region A in FIG. 19.
Figure 21:
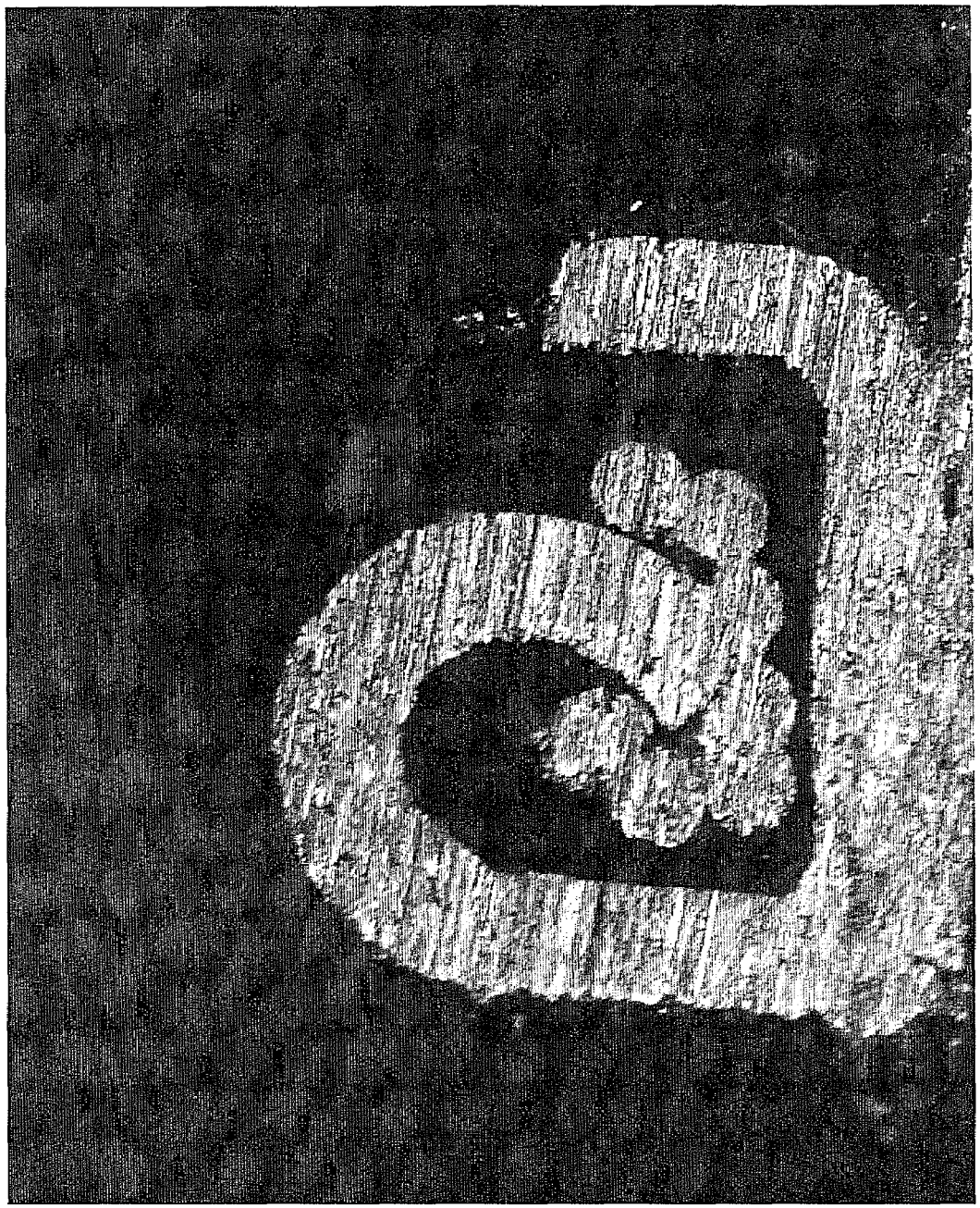
FIG. 21 is similar to FIG. 18 but shows a single row of prongs partially crimped and deflected by the tool of FIG. 19.
Figure 22:
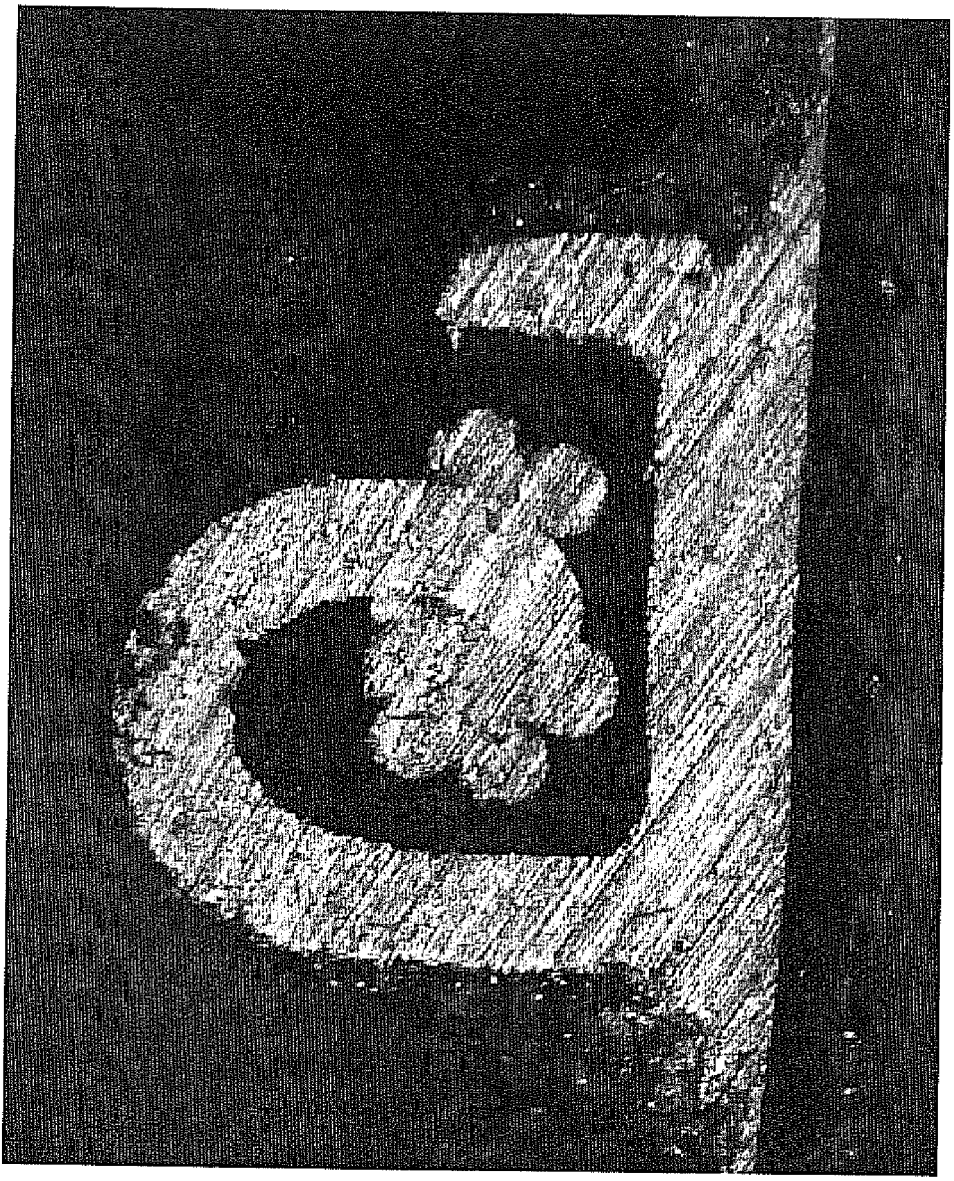
FIG. 22 is similar to FIG. 21 showing a successive stage of crimping and deflecting the prongs by further action of the tool of FIG. 19.

Referring to FIGS. 19 and 20, a modified tool 82 is shown for crimping the modified single-row of fingers of the SMT connectors 12" shown in FIGS. 15 and 16. Here, similarly, the base lower surface S is provided with a cavity 86 that has different profile than one shown in FIG. 17 in order to specifically crimp the connectors 12". The detail A in FIG. 19 is shown in FIG. 20. The upright wall 88 (FIG. 20) is provided with a tapered surface 96 having a height 96a and width 96b to define angle θ greater than 90°. In the example shown, 96a is 0.01", 96b is 0.003" to provide an angle θ of 105°. This angle is not critical and other angles may be used to lead the fingers into the cavity 86 with different degrees of advantage. As with shown in FIG. 17, the upright surface 88 in FIG. 20 merges with a cylindrical surface 90 and terminates in a horizontal bearing surface 92 that is parallel to the base surface S. A lateral surface 94 can be used to contain the materials including the modified connector 12" and the single conductor that is captured within it when being crimped. The specific angle β of the lateral surface 94 in relation to the base surface S is not critical. In the example shown, the maximum height $h_1$ of the cavity 86 is 0.048" while the width of the cavity up to the point where the surfaces 92 and 94 meet is equal to 0.06". FIGS. 21 and 22 show two successive time points and crimping conditions when crimping the modified connector 12"

With the construction shown and described, the zipcord connector 12 provides surface mounting with opposing spaced fingers, each set of which is suitable for piercing of an associated connector of a zipcord to make both good mechanical connection with wire and the individual conductor strength inside the insulation while damaging a minimum number of wire strands. The connector 12 provides reliable strength relief to hold the wire securely. A connector 12 can be easily placed on a PCB with one action with no pre-treatment of the wire. The top down curling action provides good strength relief and makes good connection to the strand despite the inconsistent strand positioning within the wire. This curling is assisted by the V-shaped score lines on the row(s) or fingers. This zipcord connector in accordance with the invention also provides electrical insulation between the individual spaced fingers while maintaining this spacing at substantially constant and predictable dimensions to prevent the fingers from floating apart or coming together to make crimping inconsistent. This has been realized in a practical way by using Kapton® tape on the bottom of the part that effectively makes the spaced individual conductive fingers one integrated piece that maintains the desired spacing precisely between the fingers, as well as maintain the outer walls parallel to each other while electrically insulating the two sets of fingers from each other.

The advantages of the zipcord in accordance with the invention allows the rapid and secure termination of a zipcord to a circuit board using surface mount features. It is quicker and more efficient than a process that requires separation of the wires and does not require any preparation of the individual wires prior to termination. The invention also allows the same zipcord wire to continue beyond the connector for further parallel terminations on the same or other PCB's.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The invention claimed is:

1. A surface mount connector comprises at least one conductive contact; said at least one conductive contact including a substantially flat base portion suitable for soldering to a pad or land on a printed circuit board (PCB) and at least one vertical finger extending substantially normally from said flat base portion and each terminating in a point or hook formed with a piercing tip at the free end thereof remote from said that base portion; and
   said at least one vertical finger and flat base portion defining a space for receiving an insulated conductor arranged in a plane substantially parallel to the plane of said flat base portion, said piercing tip of said at least one finger being bent inwardly prior to crimping and deformation to be at least partially superpositioned over an associated flat base portion and configured to deflect inwardly in a curling action when forced downwardly and crimped to pierce an associated insulated conductor positioned on said flat base portion.

2. The surface mount connector as defined in claim 1, wherein a pair of conductive contacts are spaced from each other that are substantially minor images of each other and each having at least one vertical finger directed inwardly in a direction of said at least one vertical finger of an opposing conductive contact to define a space therebetween for receiving a zipcord or two single insulated wires.

3. The surface mount connector as defined in claim 1, wherein a plurality of vertical fingers are provided arranged in a row.

4. The surface mount connector as defined in claim 3, wherein adjacent fingers in a row are arranged to each move independently of each other.

5. The surface mount connector as defined in claim 4, wherein said fingers are uniformly spaced from each other.

6. The surface mount connector as defined in claim 1, wherein said at least one vertical finger is provided with means for promoting crimping of said piercing tip when pressure is applied in the direction of said base portion by a crimping tool.

7. The surface mount connector as defined in claim 6, wherein said means for promoting crimping comprises at least one coin for weakening said at least one finger on one side thereof facing said base portion.

8. The surface mount connector as defined in claim 7, wherein a plurality of coins are provided spaced from each other along said finger.

9. The surface mount connector as defined in claim 8, wherein said coins are V-shaped indented lines.

10. The surface mount connector as defined in claim 2, wherein an insulating tape secures said pair of spaced conductive contacts to each other and maintains desired spacing and electrical isolation therebetween.

11. The surface mount connector as defined in claim 1, wherein a plurality of surface mount connector are secured to each other along a strip.

12. The surface mount connector as defined in claim 1, wherein a plurality of surface mount connectors are provided on a continuous tape provided with pockets.

13. A tool for crimping a surface mount connector comprising at least one conductive contact; said at least one conductive contact including a substantially flat base portion suitable for soldering to a pad or land on a printed circuit board (PCB) and at least one vertical finger extending substantially normally from said flat base portion and each terminating in a point or hook formed with a piercing tip at the free end thereof remote from said that base portion; and
   said at least one vertical finger and flat base portion defining a space for receiving an insulated conductor arranged in a plane substantially parallel to the plane of said flat base portion, said piercing tip of said at least one finger being bent inwardly prior crimping and deformation to be at least partially superpositioned over an associated flat base portion and configured to deflect inwardly in a curling action when forced downwardly and crimped to pierce an associated insulated conductor positioned on said flat base portion;
   the tool comprising a die having a lower base surface and a cavity within the die extending inwardly from said lower base surface to form at least one side wall merging with a cylindrical surface for engaging said at least one vertical finger and crimping it when lowered toward said base portion and PCB on which the connector is surface mounted, said cylindrical surface being configured to crimp said at least one finger to bend or curl inwardly into a conductor arranged on said flat base portion to contact stands within the conductor.

14. The tool for crimping a surface mount connector as defined in claim 13, further comprising a generally flat retaining surface extending from said cylindrical surface and substantially parallel to said lower base surface.

15. The tool for crimping a surface mount connector as defined in claim 13, wherein the connector includes two spaced rows of vertical fingers, and said tool cavity having two side walls spaced to correspond to spacing of said vertical fingers to receive said vertical fingers with clearance into said cavity, and two spaced cylindrical surfaces arranged to crimp and bend inwardly both said rows of vertical fingers into two separate conductors or a zipcord.

16. The tool for crimping a surface mount connector as defined in claim 15, wherein a generally flat retaining surface extends between said spaced cylindrical cavities.

17. The tool for crimping a surface mount connector as defined in claim 13, further comprising a taper in the region where said lower base surface meets said at least one side wall.

18. The tool for crimping a surface mount connector as defined in claim 17, said tape defines an angle of approximately 105°.

19. The tool for crimping a surface mount connector as defined in claim 14, wherein a maximum height of said cavity is $h_1$ and said flat retaining surface is spaced a height $h_2$ above said base surface and selected such that $\delta = h_1 - h_2$ is within the range of 10-25% of $h_1$.

20. A surface mount connector comprises a pair of opposing connected electrically isolated conductive contacts each conductive contact including a substantially flat base portion suitable for soldering to a pad or land on a printed circuit board (PCB) and at least one vertical finger extending substantially normally from said flat base portion and each terminating in a point or hook formed with a piercing tip at the free end thereof remote from said that base portion, said conductive contacts being spaced from each other and each having at least one vertical finger directed inwardly in a direction of said at least one vertical finger of an opposing conductive contact to define a space therebetween and said base portions for receiving a zipcord of two single insulated wires said vertical fingers and flat base portions defining a space for receiving an insulated conductor arranged in a plane substantially parallel to the plane of said flat base portions, said piercing tip of said at least one finger being bent inwardly prior crimping and deformation to be at least partially superpositioned over an associated flat base portion and configured to deflect inwardly in a curling action when forced downwardly and crimped to pierce an associated insulated conductor positioned on said flat base portion.

\* \* \* \* \*